United States Patent [19]
Hori

[11] Patent Number: 5,686,756
[45] Date of Patent: Nov. 11, 1997

[54] COMPOUND FIELD EFFECT TRANSISTOR HAVING A CONDUCTIVE LAYER COMPRISING A III-V GROUP COMPOUND

[75] Inventor: Yasuko Hori, Tokyo, Japan

[73] Assignee: NEC Corporation, Tokyo, Japan

[21] Appl. No.: 587,386

[22] Filed: Jan. 17, 1996

[30] Foreign Application Priority Data

Jan. 20, 1995 [JP] Japan .................. 7-026247
Jan. 20, 1995 [JP] Japan .................. 7-026248

[51] Int. Cl.$^6$ .................. H01L 23/58; H01L 31/0328
[52] U.S. Cl. .................. 257/631; 257/192
[58] Field of Search .................. 257/631, 632, 257/280, 192, 194

[56] References Cited

PUBLICATIONS

"Analysis of electrical and optical properties of insulating film–GaAs interfaces using MESFET-type structures," M. Ozeki et al, J. Vac. Sci. Technol., 21(2), Jul./Aug. 1982, pp. 438–441.

"Correlation Between Surface-State Density and Impact Ionization Phenomena in GaAs MESFET's," A. Paccagnella et al, IEEE Transactions on Electron Devices, vol. 38, No. 12, Dec. 1991, pp. 2682–2684.

*Primary Examiner*—Steven H. Loke
*Attorney, Agent, or Firm*—Laff Whitesel Conte & Saret Ltd.

[57] ABSTRACT

A compound semiconductor field effect transistor has a semiconductive layer made of a compound which consists of a single III group element and a single V group element or a compound which consists of two III group elements and a single V group element in the periodic table and a passivation film for protecting the surface of the semiconductive layer. This passivation film is formed of a chalcopyrite made of a compound which consists of a single I group element, a single III group element and two VI group elements or chalcopyrite made of a compound which consists of a single II group element, a single IV group element and two V group elements in the periodic table. Those chalcopyrites have lattice constants close to or equal to a lattice constant of the semiconductive layer. Those chalcopyrites have band gaps wider than that of the semiconductive layer. The semiconductive layer may be GaAs and InP. The chalcopyrite may be $(Cu_{0.12}Ag_{0.88})AlS_2$ and $(Zn_{0.04}Cd_{0.96})SiP_2$.

7 Claims, 3 Drawing Sheets

COMPOUND FIELD EFFECT TRANSISTOR HAVING A CONDUCTIVE LAYER COMPRISING A III-V GROUP COMPOUND

BACKGROUND OF THE INVENTION

1. Field of the Invention

The present invention relates to a field effect transistor, and, more particularly, to a compound semiconductor field effect transistor using conductive layer made of compound which consists of a single III group element and a single V group element or a compound which consists of two III group elements and a single V group element for a semiconductor portion.

2. Description of the Related Art

In a conventional semiconductor device using a semiconductive layer consisting of a compound of a single III group element and a single V group element or a compound of two III group elements and a single V group element in the periodic table (a III-V group compound), $SiO_3$, SiON or $Si_3N_4$ is used for a passivation film which protects the surface of the semiconductive layer.

FIG. 1 is an exemplary cross-sectional view showing a conventional MESFET device using a GaAs semiconductive layer. An impurity-undoped GaAs buffer layer 12, an n type GaAs active layer 13 and an n type GaAs contact layer 14 are epitaxially grown on a semiconductive GaAs substrate 11. A source electrode 15 and a drain electrode 16, made of metal for ohmic contact, are selectively formed on the n type GaAs contact layer 14 by photolithographic lift-off or the like. Then, the source electrode 15 and drain electrode 16 are alloyed so that whose metal elements are permeated through the n type GaAs contact layer 14 to reach the n type GaAs active layer 13. This structure reduces the electric resistances between the source electrode 15 and the n type GaAs active layer 13 and between the drain electrode 16 and the n type GaAs active layer 13. The n type GaAs contact layer 14 between the source electrode 15 and drain electrode 16 is selectively etched off, exposing the n type GaAs active layer 13. A gate electrode 17 is then formed on the exposed n type GaAs active layer 13. Therefore, the gate electrode 17 and the n type GaAs active layer 13 form a Schottky junction. An $Si_3N_4$ passivation film 19 is formed on the surface of the resultant structure, excluding the source electrode 15 and drain electrode 16 to protect this surface.

FIG. 2 is an exemplary cross-sectional view showing a conventional HJFET device using an InP semiconductive layer. An impurity-undoped InAlAs buffer layer 22, an impurity-undoped InGaAs channel layer 23, an n type InAlAs donor layer 24 and an $n^+$ type InGaAs contact layer 25 are epitaxially grown on a semiconductive InP substrate 21. A source electrode 26 and a drain electrode 27, made of metal for ohmic contact, are selectively formed on the $n^+$ type InGaAs contact layer 25 by photolithographic lift-off or the like. The source electrode 26 and drain electrode 27 are alloyed to reduce the electric resistances between the source electrode 26 and the impurity-undoped InGaAs channel layer 23 and between the drain electrode 27 and the impurity-undoped InGaAs channel layer 23. The $n^+$ type InGaAs contact layer 25 between the source electrode 26 and drain electrode 27 is selectively etched off, exposing the n type InAlAs donor layer 24. A gate electrode 28 is then formed on the exposed n type InAlAs donor layer 24. An $Si_3N_4$ passivation film 29 is formed on the surface of the resultant structure, excluding the source electrode 26 and drain electrode 27 to protect this surface.

According to the conventional techniques, the passivation film is formed by an amorphous film, and it is deposited on a III-V group compound semiconductive layer which is a single crystal. The interface between the passivation film and the III-V group compound semiconductive layer is very sensitive to the film forming conditions, and different stresses are produced between this passivation film and the semiconductor device portion.

When $Si_3N_4$ formed by ultraviolet excitation is used for the passivation film of a GaAs MESFET, for example, slight tensile stress is produced. When $Si_3N_4$ formed by plasma excitation at the normal temperature is used, compressive stress is produced which becomes stronger as the temperature rises.

When an amorphous film is used as the passivation film, various stresses are produced according to the film forming conditions. Such stresses derive a specific phenomenon like a piezoelectric effect to vary the device characteristics or reduce the adhesion like pealing. Further, a surface potential is generated by a physical damage (radiation damage) when an insulating film is deposited, or by the dangling bond between the insulating film and semiconductor. The generated surface potential increases the leak current of the semiconductor device, deteriorating the device characteristics. The device characteristics of such GaAs MESFETs are described in, for example, IEEE TRANSACTIONS ON ELECTRON DEVICES, VOL. 38, NO. 12, DECEMBER 1991 and J. Vac. Sci. Technol., 21(2), July/August 1982.

This deterioration of the device characteristics is essentially caused by stress and the surface potential produced by the difference between the lattice constants of the semiconductor device portion and the passivation film. To match the lattice constant of the semiconductor device portion with that of the passivation film, therefore, a III-V group semiconductor layer which is the same material as that of the semiconductor device portion may be used. As the III-V group compound semiconductor layer has a narrow band gap, however, the leak current produced deteriorates the device characteristics.

SUMMARY OF THE INVENTION

Accordingly, it is an object of the present invention to provide a field effect transistor having a III-V group compound semiconductive layer which can prevent the semiconductor device characteristics from being deteriorated by a passivation film.

According to one aspect of this invention, there is provided a compound semiconductor field effect transistor comprises, a semiconductive layer made of a compound which consists of a single III group element and a single V group element or a compound which consists of two III group elements and a single V group element in the periodic table (III-V group compound semiconductive layer) and a passivation film for protecting a surface of the semiconductive layer, the passivation film being formed of a chalcopyrite made of a compound which consists of a single I group element, a single III group element and two VI group elements in the periodic table ($I–III–VI_2$ group chalcopyrite), and the passivation film having a lattice constant close to or equal to a lattice constant of the semiconductive layer.

It is preferable that the semiconductive layer consists of at least one compound selected from a group of GaAs, AlGaAs and InGaP, and the chalcopyrite be a compound selected from a group of $(Cu_{0.12}Ag_{0.88})AlS_2$, $(Cu_{0.5}Ag_{0.5})Al(Se_{0.5}S_{0.6})_2$, $(Cu_{0.2}Ag_{0.8})(Al_{0.2}Ga_{0.8})S_2$, and $(Cu_{0.65}Ag_{0.35})(Al_{0.65}Ga_{0.35})(Se_{0.65}S_{0.35})_2$.

It is preferable that the semiconductive layer consists of at least one compound selected from a group of InP, InAlAs and InGaAs, and the chalcopyrite be at least one compound selected from a group of $AgAl(Se_{0.66}S_{0.34})_2$, $Ag(Al_{0.6}Ga_{0.4})(Se_{0.6}S_{0.4})_2$, $(Ag_{0.27}Cu_{0.73})Al(S_{0.27}Te_{0.73})_2$, $AgGa(S_{0.4}Se_{0.6})_2$, $Ag(Al_{0.35}Ga_{0.65})(S_{0.35}Se_{0.65})_2$, $(Cu_{0.62}Ag_{0.38})(Al_{0.62}Ga_{0.38})(Te_{0.62}S_{0.38})_2$, $Ag(Al_{0.33}In_{0.67})(Se_{0.33}S_{0.67})_2$, $(Cu_{0.3}Ag_{0.7})(Al_{0.3}In_{0.7})(Te_{0.3}S_{0.7})_2$ and $Ag(Ga_{0.3}In_{0.7})(Se_{0.3}S_{0.7})_2$.

According to another aspect of this invention, there is provided a compound semiconductor field effect transistor comprises, a semiconductive layer made of a compound which consists of a single III group element and a single V group element or a compound which consists of two III group elements and a single V group element in the periodic table and a passivation film for protecting a surface of the semiconductive layer, the passivation film being formed of a chalcopyrite made of a compound which consists of a single II group element, a single IV group element and two V group elements in the periodic table (I–III–VI$_2$ group chalcopyrite), and the passivation film having a lattice constant close to or equal to a lattice constant of the semiconductive layer.

It is preferable that the chalcopyrite have a band gap wider than that of the semiconductive layer.

It is preferable that the semiconductive layer consists of at least one compound selected from a group of GaAs, AlGaAs and InGaP, and the chalcopyrite be a compound selected from a group of $CdSiP_2$ and $(Zn_{0.04}Cd_{0.96})SiP_2$.

According to a compound semiconductor field effect transistor embodying this invention, a I–III–VI$_2$ group chalcopyrite or a II–IV–V$_2$ group chalcopyrite, which is a single crystal that has lattice matching with a III–V group compound semiconductive layer, is used as a material for the passivation film for protecting the surface of the III–V group compound semiconductive layer. It is therefore possible to prevent stress from being produced at the time of forming the passivation film and prevent the surface potential from being produced by the disturbance of the crystal lattice between the passivation film and the III–V group compound semiconductive layer, thus preventing the deterioration of the characteristics of a semiconductor device.

Because the I–III–VI$_2$ group chalcopyrite or II–IV–V$_2$ group chalcopyrite used for a passivation film in the field effect transistor according to this invention has a band gap wider than that of the III–V group compound semiconductive layer, it is possible to prevent the escape of electrons in a semiconductor device outside to produce a large leak current.

DETAILED DESCRIPTION OF THE PREFERRED EMBODIMENTS

Preferred embodiments of the present invention will now be specifically described with reference to the accompanying drawings.

Figure 1:
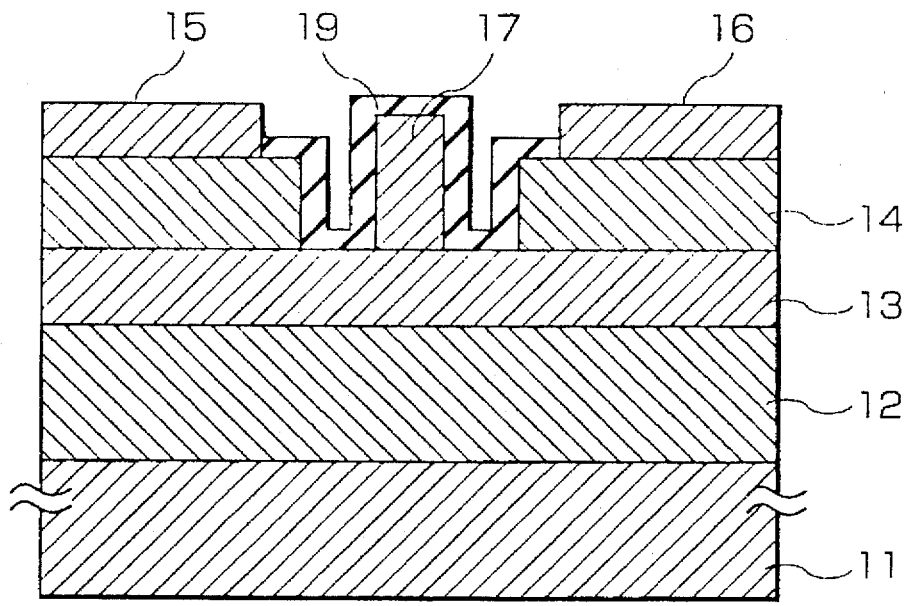
FIG. 1 is an exemplary cross-sectional view showing a conventional MESFET using a GaAs semiconductor.
Figure 2:
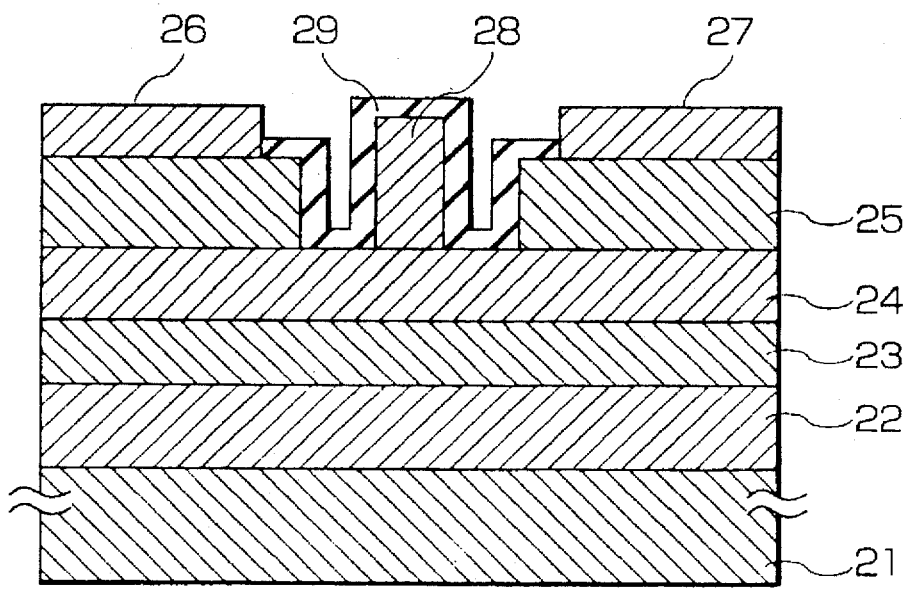
FIG. 2 is an exemplary cross-sectional view showing a conventional HJFET using an InP semiconductor.
Figure 3:
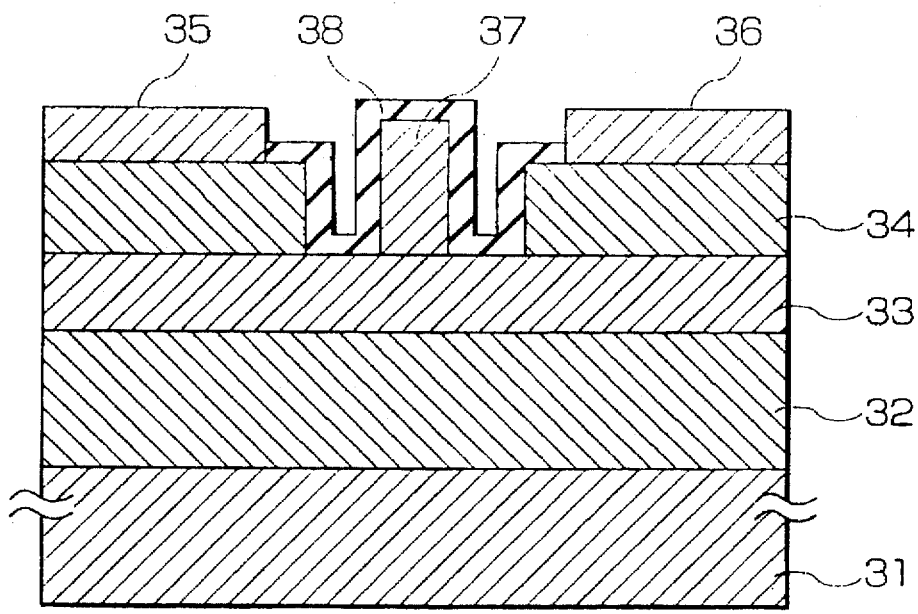
FIG. 3 is an exemplary cross-sectional view showing a compound semiconductor field effect transistor according to the first embodiment of this invention.

FIG. 3 is an exemplary cross-sectional view showing a compound semiconductor field effect transistor according to the first embodiment of this invention. As shown in FIG. 3, an impurity-undoped GaAs buffer layer 32, an n type GaAs active layer 33 and an n type GaAs contact layer 34 are epitaxially grown on a semiconductive GaAs substrate 31. This n type GaAs contact layer 34 is formed to enhance the ohmic contact.

A source electrode 35 and a drain electrode 36, made of metal for ohmic contact such as AuGe or Ni, are selectively formed on the n type GaAs contact layer 34 by photolithographic lift-off or the like. The source electrode 35 and drain electrode 36 are alloyed so that whose metal elements are permeated through the n type GaAs contact layer 34 to reach the n type GaAs active layer 33. This structure reduces the electric resistances between the source electrode 35 and the n type GaAs active layer 33 and between the drain electrode 36 and the n type GaAs active layer 33.

The n type GaAs contact layer 34 between the source electrode 35 and drain electrode 36 is selectively etched off, exposing the n type GaAs active layer 33. A gate electrode 37 is then formed on the exposed n type GaAs active layer 33, forming a Schottky junction. A passivation film 38 having a thickness of, for example, about 100 nm is formed on the surface of the resultant structure, excluding the source electrode 35 and drain electrode 36 to protect this surface.

As the passivation film 38, $(Cu_xAg_{1-x})AlS_2$, $(Cu_xAg_{1-x})Al(Se_xS_{1-x})_2$, $(Cu_xAg_{1-x})(Al_xGa_{1-x})S_2$, or $(Cu_xAg_{1-x})(Al_xGa_{1-x})(Se_xS_{1-x})_2$ or the like, which belongs to a I–III–VI$_2$ group chalcopyrite can be used. $CdSiP_2$ or $(Zn_xCd_{1-x})SiP_2$ or the like, which belongs to a II–IV–V$_2$ group chalcopyrite can also be used. The I–III–VI$_2$ group chalcopyrite is a compound which consists of a single I group element, a single III group element and two VI group elements in the periodic table, and the II–IV–V$_2$ group chalcopyrite is a compound which consists of a single II group element, a single IV group element and two V group elements in the periodic table.

As the I–III–VI$_2$ group chalcopyrite and II–IV–V$_2$ group chalcopyrite have sufficiently wide band gaps, it is possible to prevent the device characteristics from being deteriorated by conditions for forming the passivation film. Because the lattice constant of the I–III–VI$_2$ group chalcopyrite and the II–IV–V$_2$ group chalcopyrite can be determined freely by changing the composition thereof, the I–III–VI$_2$ group chalcopyrite and the II–IV–V$_2$ group chalcopyrite can be applied to the variety of material which constitutes the semiconductive layer. For example, in the first embodiment, "x" should be so selected as to match the lattice constant of the I–III–VI$_2$ group chalcopyrite with the lattice constant of GaAs (5.65 angstroms). For example, by determining "x" so as to match the lattice constants of both materials to each other, the I–III–VI$_2$ group chalcopyrite is shown by the composition of $(Cu_{0.12}Ag_{0.88})AlS_2$, $(Cu_{0.5}Ag_{0.5})Al(Se_{0.5}S_{0.5})_2$, $(Cu_{0.2}Ag_{0.8})(Al_{0.2}Ga_{0.8})S_2$, or $(Cu_{0.65}Ag_{0.35})(Al_{0.65}Ga_{0.35})(Se_{0.65}S_{0.35})_2$. Likewise, "x" should be so selected as to match the lattice constant of the II–IV–V$_2$ group chalcopyrite with the lattice constant of GaAs. For example, II–IV–V$_2$ group chalcopyrite is shown by the composition of $CdSiP_2$ or $(Zn_{0.04}Cd_{0.96})SiP_2$.

The passivation film may be formed by MBE (Molecular Beam Epitaxy) or MOCVD. The passivation film can be formed evenly with excellent controllability of the film thickness and film quality of the passivation film, so that the reliability and productivity of semiconductor devices can be improved.

Figure 4:
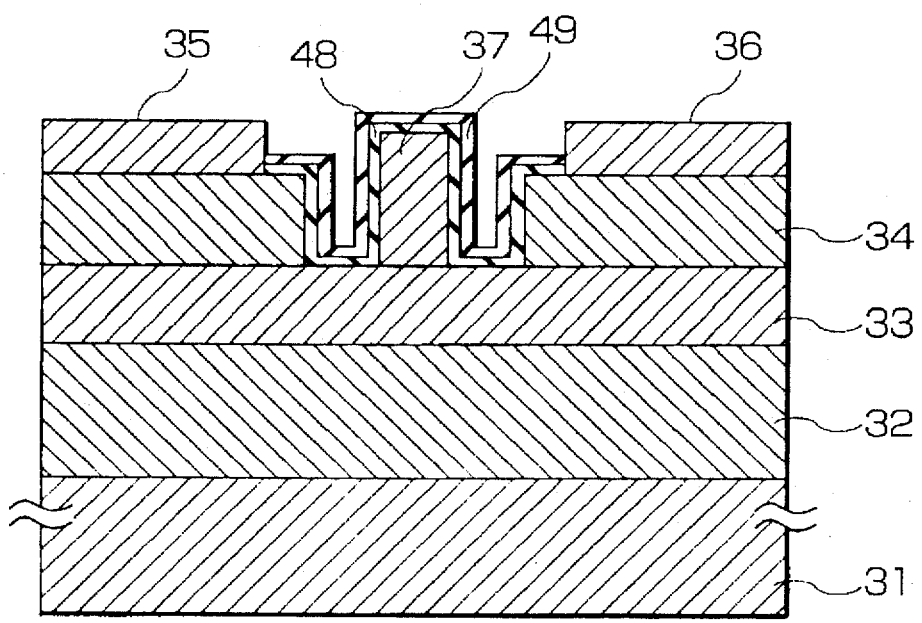
FIG. 4 is an exemplary cross-sectional view showing a compound semiconductor field effect transistor according to the second embodiment of this invention.

FIG. 4 is an exemplary cross-sectional view showing a compound semiconductor field effect transistor according to the second embodiment of this invention. FIG. 4 uses same reference numerals as used in FIG. 3 to denote corresponding or identical elements to avoid repeating their detailed descriptions.

As shown in FIG. 4, a passivation film 48 having a thickness of, for example, about 50 nm is formed on the surface of the structure, excluding the source electrode 35 and drain electrode 36 to protect this surface. This embodiment differs from the first embodiment that an $SiO_2$ film 49 having a thickness of, for example, about 100 nm is formed on the passivation film 48.

Since the base is a III–V group compound semiconductive layer which consists of GaAs in this embodiment, a I–II–I–$VI_2$ group chalcopyrite or II–IV–$V_2$ group chalcopyrite can be used for the passivation film 48, as per the first embodiment. Although the $SiO_2$ film 49 is formed on the passivation film 48 in the second embodiment, it may be an amorphous film made of SiON, $Si_3N_4$ or the like.

Figure 5:
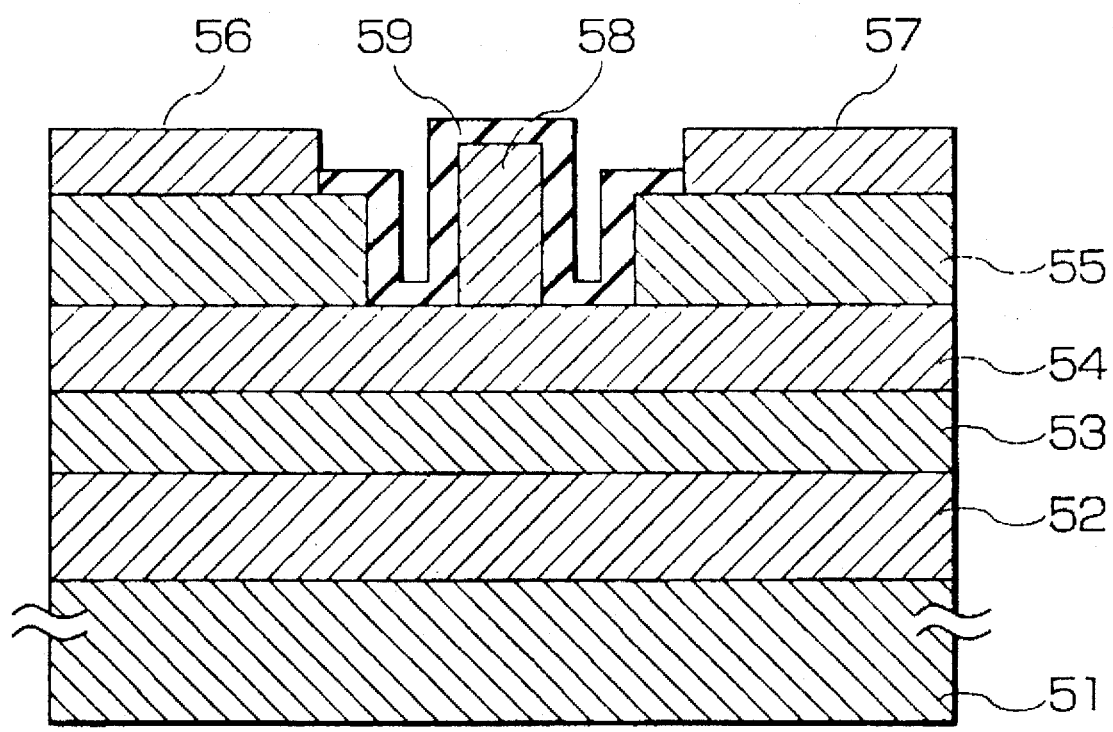
FIG. 5 is an exemplary cross-sectional view showing a compound semiconductor field effect transistor according to the third embodiment of this invention.

FIG. 5 is an exemplary cross-sectional view showing a compound semiconductor field effect transistor according to the third embodiment of this invention. As shown in FIG. 5, an impurity-undoped InAlAs buffer layer 52, an impurity-undoped InGaAs channel layer 53, n type InAlAs donor layer 54 and $n^+$ type InGaAs contact layer 55 are epitaxially grown on a semiconductive InP substrate 51. This $n^+$ type InGaAs contact layer 55 is formed to enhance the ohmic contact.

A source electrode 56 and a drain electrode 57, made of metal for ohmic contact such as AuGe or Ni, are selectively formed on the $n^+$ type InGaAs contact layer 55 by photo-lithographic lift-off or the like. The source electrode 56 and drain electrode 57 are alloyed so that whose alloy elements are permeated through the $n^+$ type InGaAs contact layer 55 and n type InAlAs donor layer 54 to reach the impurity undoped InGaAs channel layer 53. This structure reduces the electric resistances between the source electrode 56 and the impurity-undoped InGaAs channel layer 53 and between the drain electrode 57 and the impurity-undoped InGaAs channel layer 53.

The $n^+$ type InGaAs contact layer 55 between the source electrode 56 and drain electrode 57 is selectively etched off, exposing the n type InAlAs donor layer 54. A gate electrode 58 is then formed on the exposed n type InAlAs donor layer 54, thus forming a Schottky junction. A passivation film 59 having a thickness of, for example, about 100 nm is formed on the surface of the resultant structure, excluding the source electrode 56 and drain electrode 57 to protect this surface.

As this passivation film 59, $AgAl(Se_xS_{1-x})_2$, $Ag(Al_xGa_{1-x})(Se_xS_{1-x})_2$, $Ag_xCu_{1-x}Al(S_xTe_{1-x})_2$, $AgGa(S_xSe_{1-x})_2$, $Ag(Al_xGa_{1-x})(S_xSe_{1-x})_2$, $(Cu_xAg_{1-x})(Al_xGa_{1-x})(Te_xS_{1-x})_2$, $Ag(Al_xIn_{1-x})(Se_xS_{1-x})_2$, $(Cu_xAg_{1-x})(Al_xIn_{1-x})(Te_xS_{1-x})_2$ or $Ag(Ga_xIn_{1-x})(Se_xS_{1-x})_2$ or the like, which belongs to the I–III–$VI_2$ group chalcopyrite can be used.

As the I–III–$VI_2$ group chalcopyrite has a sufficiently wide band gap, as mentioned above, it is possible to prevent the device characteristics from being deteriorated by conditions for forming the passivation film. Because the lattice constant of the I–III–$VI_2$ group chalcopyrite can be determined freely by changing the composition thereof, the I–III–$VI_2$ group chalcopyrite can be applied to the variety of material which constitutes the semiconductive layer. For example, in the third embodiment, "x" should be so selected as to match the lattice constant of the I–III–$VI_2$ group chalcopyrite with the lattice constant of InAlAs (5.87 angstroms).

For example, by determining "x" so as to match the lattice constants of both materials to each other, the I–III–$VI_2$ group chalcopyrite is shown by the composition of $AgAl(Se_{0.53}S_{0.34})_2$, $Ag(Al_{0.6}Ga_{0.4})(Se_{0.6}S_{0.4})_2$, $(Ag_{0.27}Cu_{0.73})Al(S_{0.27}Te_{0.73})_2$, $AgGa(S_{0.4}Se_{0.8})_2$, $Ag(Al_{0.35}Ga_{0.65})(S_{0.35}Se_{0.55})_2$, $(Cu_{0.62}Ag_{0.38})(Al_{0.62}Ga_{0.38})(Te_{0.62}S_{0.38})_2$, $Ag(Al_{0.33}In_{0.67})(Se_{0.33}S_{0.67})_2$, $(Cu_{0.3}Ag_{0.7})(Al_{0.3}In_{0.7})(Te_{0.3}S_{0.7})_2$, or $Ag(Ga_{0.3}In_{0.7})(Se_{0.3}S_{0.7})_2$. The passivation film may be formed by MBE or MOCVD. Further, an amorphous film made of $SiO_2$, SiON, $Si_3N_4$ or the like may be formed on the passivation film 59 consisting of the I–III–$VI_2$ group chalcopyrite in the third embodiment, as per the second embodiment shown in FIG. 4.

Although this invention is adapted for a GaAs-base MESFET and an InP-base hetero junction FET in the first to third embodiments, this invention is not limited to those types. For example, this invention may be adapted for a field effect transistor which uses any III–V group compound semiconductive layer, regardless of the lattice matched system or the lattice unmatched system.

What is claimed is:

1. A compound semiconductor field effect transistor comprising;

a semiconductive layer made of a compound which consists of a single III group element and a single V group element or a compound which consists of two III group elements and a single V group element in the periodic table and a passivation film for protecting a surface of said semiconductive layer, said passivation film being formed of a chalcopyrite made of a compound which consists of a single I group element, a single III group element and two VI group elements in the periodic table, and said passivation film having a lattice constant close to or equal to a lattice constant of said semiconductive layer.

2. The compound semiconductor field effect transistor according to claim 1, wherein said chalcopyrite has a band gap wider than that of said semiconductive layer.

3. The compound semiconductor field effect transistor according to claim 1, wherein said semiconductive layer consists of at least one compound selected from a group of GaAs, AlGaAs and InGaP, and said chalcopyrite is a compound selected from a group of $(Cu_{0.12}Ag_{0.88})AlS_2$, $(Cu_{0.5}Ag_{0.5})Al(Se_{0.5}S_{0.5})_2$, $(Cu_{0.2}Ag_{0.6})(Al_{0.2}Ga_{0.8})S_2$, and $(Cu_{0.65}Ag_{0.35})(Al_{0.65}Ga_{0.35})(Se_{0.65}S_{0.35})_2$.

4. The compound semiconductor field effect transistor according to claim 1, wherein said semiconductive layer consists of at least one compound selected from a group of InP, InAlAs and InGaAs, and said chalcopyrite is at least one compound selected from a group of $AgAl(Se_{0.66}S_{0.34})_2$, $Ag(Al_{0.6}Ga_{0.4})(Se_{0.6}S_{0.4})_2$, $(Ag_{0.27}Cu_{0.73})Al(S_{0.27}Te_{0.73})_2$, $AgGa(S_{0.4}Se_{0.6})_2$, $Ag(Al_{0.35}Ga_{0.65})(S_{0.35}Se_{0.65})_2$, $(Cu_{0.62}Ag_{0.38})(Al_{0.62}Ga_{0.38})(Te_{0.62}S_{0.38})_2$, $Ag(Al_{0.33}In_{0.67})(Se_{0.33}S_{0.67})_2$, $(Cu_{0.3}Ag_{0.7})(Al_{0.3}In_{0.7})(Te_{0.3}S_{0.7})_2$ and $Ag(Ga_{0.3}In_{0.7})(Se_{0.3}S_{0.7})_2$.

5. A compound semiconductor field effect transistor comprising;

a semiconductive layer made of a compound which consists of a single III group element and a single V group element or a compound which consists of two III group elements and a single V group element in the periodic table and a passivation film for protecting a surface of said semiconductive layer, said passivation film being formed of a chalcopyrite made of a compound which consists of a single II group element, a single IV group element and two V group elements in the periodic table, and said passivation film having a lattice constant close to or equal to a lattice constant of said semiconductive layer.

6. The compound semiconductor field effect transistor according claim 5, wherein said chalcopyrite has a band gap wider than that of said semiconductive layer.

7. The compound semiconductor field effect transistor according claim 5, wherein said semiconductive layer consists of at least one compound selected from a group of GaAs, AlGaAs and InGaP, and said chalcopyrite is a compound selected from a group of $CdSiP_2$ and $(Zn_{0.04}Cd_{0.96})SiP_2$.

* * * * *